United States Patent
Schat et al.

(10) Patent No.: US 10,901,023 B2
(45) Date of Patent: Jan. 26, 2021

(54) APPARATUSES AND METHODS INVOLVING ADJUSTABLE CIRCUIT-STRESS TEST CONDITIONS FOR STRESSING REGIONAL CIRCUITS

(71) Applicant: NXP B.V., Eindhoven (NL)

(72) Inventors: Jan-Peter Schat, Hamburg (DE); Abdellatif Zanati, Hamburg (DE)

(73) Assignee: NXP B.V., Eindhoven (NL)

( * ) Notice: Subject to any disclaimer, the term of this patent is extended or adjusted under 35 U.S.C. 154(b) by 218 days.

(21) Appl. No.: 16/059,547

(22) Filed: Aug. 9, 2018

(65) Prior Publication Data

US 2020/0049756 A1 Feb. 13, 2020

(51) Int. Cl.
*G01R 31/14* (2006.01)
*G01R 31/18* (2006.01)
*G01R 31/28* (2006.01)

(52) U.S. Cl.
CPC ............ *G01R 31/14* (2013.01); *G01R 31/18* (2013.01); *G01R 31/2856* (2013.01); *G01R 31/2874* (2013.01); *G01R 31/2879* (2013.01)

(58) Field of Classification Search
CPC .... G01R 31/14; G01R 31/2879; G01R 31/18; G01R 31/2856; G01R 31/2874; G01R 31/3004; G01R 31/2858
See application file for complete search history.

(56) References Cited

U.S. PATENT DOCUMENTS

| | | | |
|---|---|---|---|
| 6,724,214 B2 | 4/2004 | Manna et al. | |
| 6,903,564 B1 * | 6/2005 | Suzuki | G01R 31/2884 324/762.02 |
| 7,271,608 B1 * | 9/2007 | Vermeire | G01R 31/2856 324/750.3 |
| 8,692,571 B2 | 4/2014 | Lai et al. | |
| 8,839,180 B1 | 9/2014 | Li et al. | |
| 9,310,424 B2 | 4/2016 | Allen-Ware et al. | |

(Continued)

OTHER PUBLICATIONS

J. S. Suehle; P. Chaparala; C. Messick; W. M. Miller; K. C. Boyko, "Experimental Investigation of the Validity of TDDB Voltage Acceleration Models," International Integrated Reliability Workshop Final Report, 1993, pp. 59-67.

(Continued)

*Primary Examiner* — Lee E Rodak
(74) *Attorney, Agent, or Firm* — Rajeev Madnawat

(57) ABSTRACT

An example method includes stressing, under different circuit-stress test conditions, a plurality of different types of regional circuits susceptible to time dependent dielectric breakdown (TDDB), and in response, monitoring for levels of reliability failure associated with the plurality of different types of regional circuits. The method includes storing a set of stress-test data based on each of the levels of reliability failure, the set of stress-test data being stored within the integrated circuit to indicate reliability-threshold test data specific to the integrated circuit. Within the integrated circuit, an on-chip monitoring circuit indicates operational conditions of suspect reliability associated with dielectric breakdown of at least one of the plurality of different types of regional circuits. And, the method further includes, during operation of the integrated circuit, adjusting at least one of the different circuit-stress test conditions based on the indicated operational conditions of suspect reliability.

20 Claims, 4 Drawing Sheets

(56) References Cited

U.S. PATENT DOCUMENTS

| | | | |
|---|---|---|---|
| 9,608,619 B2 | 3/2017 | Stuber et al. | |
| 2008/0141072 A1 | 6/2008 | Kalgren et al. | |
| 2009/0083598 A1* | 3/2009 | Dixit | G01R 31/3187 714/733 |
| 2011/0181315 A1* | 7/2011 | Krishnan | G01R 31/3016 324/762.01 |
| 2013/0038334 A1 | 2/2013 | Brochu, Jr. et al. | |
| 2014/0095127 A1 | 4/2014 | Weir et al. | |
| 2016/0061880 A1* | 3/2016 | Uppal | G11C 29/50 324/762.01 |
| 2016/0069950 A1 | 3/2016 | Chen et al. | |
| 2016/0178694 A1 | 6/2016 | Fry et al. | |
| 2016/0274180 A1 | 9/2016 | Hours et al. | |
| 2017/0299649 A1* | 10/2017 | Coyne | G01R 31/2874 |
| 2019/0187204 A1 | 6/2019 | Doescher et al. | |

OTHER PUBLICATIONS

Jin Qin; Joseph B. Bernstein, „Non-Arrhenius Temperature Acceleration for Semiconductor Device involving Multiple Failure Mechanisms, 2006 IEEE International Integrated Reliability Workshop Final Report, pp. 93-97.

Characterization and Estimation of Circuit Reliability Degradation under NBTI using On Line Iddq Measurement Kunhyuk Kang; Keejong Kim; Ahmad E. Islam; Muhammad A. Alam; Kaushik Roy 2007 44th ACM/IEEE Design Automation Conference pp. 358-363.

SRAM stability analysis considering gate oxide SBD NBTI and HCI Jin Qin; Xiaojun Li; Joseph B. Bernstein, 2007 IEEE International Integrated Reliability Workshop Final Report, pp. 33-37.

Correlation between I—V slope and TDDB voltage acceleration for Cu/low-k interconnects F. Chen; J. Gambino; M. Shinosky; B. Li; O. Bravo; M. Angyal; D. Badami; J. Aitken, 2009 IEEE International Interconnect Technology Conference, pp. 182-184.

DRAM Errors in the Wild: A Large-Scale Field Study, Bianca Schroeder, Eduardo Pinheiro, and Wolf-Dietrich Weber, , SIGMETRICS (2009).

Impact of charge trapping on the voltage acceleration of TDDB in metal gate/high-k n-channel MOSFETs, Kerber; A. Vayshenker; D. Lipp; T. Nigam; E. Cartier 2010 IEEE International Reliability Physics Symposium pp. 369-372.

Temperature Dependence of TDDB acceleration in high-κ/ SiO2 bilayers and SiO2 gate dielectrics, Ernest Wu; Jordi Suñé; Charles LaRow; Roger Dufresne, 2012 International Electron Devices Meeting, pp. 28.5.1-25.5.4.

Design of CMOS logic gates with enhanced robustness against aging degradation, P.F. Butzen et. al., Microelectronics Reliability 52 (2012), pp. 1822-1826.

Mitigating_Lifetime_Underestimation_a_system-level_approach, Kai-Chiang Wu; Ming-Chao Lee; Diana Marculescu; Shih-Chieh Chang, 2012 Design, Automation & Test in Europe Conference & Exhibition (DATE) pp. 1269-1274.

A new insight into BEOL TDDB Lifetime Model for advanced technology scaling M. N. Chang; Y.-H. Lee; S. Y. Lee; K. Joshi; C. C. Ko; C. C. Chiu; K. Wu 2015 IEEE International Electron Devices Meeting (IEDM) pp. 7.4.1-7.4.4.

The Impact of Inverter like Transitions on device TDDB and ring oscillators, T.-Y. Yew; Y.-C. Huang; M.-H. Hsieh; W. Wang; Y.-H. Lee, 2015 IEEE International Reliability Physics Symposium, pp. GD.1.1-GD.1.5.

Modeling Residual Life of an IC considering multiple aging mechanisms, Md Nazmul Islam; Sandip Kundu 2016 IEEE 25th North Atlantic Test Workshop (NATW), pp. 24-27.

Field acceleration factor extraction in MOL and BEOL TDDB Tian Shen; Kong Boon Yeap; Cathryn Christiansen; Patrick Justison 2017 IEEE International Reliability Physics Symposium (IRPS), p. DG-2.1-DG-2.5.

Dhanoop Varghese, Muhammad Ashraful Alam, "A Generalized, IB-independent, Physical HCI Lifetime Projection Methodology based on Universality of Hot-Carrier Degradation," School of Electrical and Computer Engineering, Purdue University, IEEE (2010).

* cited by examiner

APPARATUSES AND METHODS INVOLVING ADJUSTABLE CIRCUIT-STRESS TEST CONDITIONS FOR STRESSING REGIONAL CIRCUITS

OVERVIEW

Aspects of various embodiments are directed to adjusting circuit-stress test conditions for stressing regional circuits.

Integrated circuits (IC) can have a lifetime that is restricted by Time-Dependent Dioxide Breakdown (TDDB), which occurs when high electric fields cause total breakdown of the gate resulting in failure of the transistor. Modern processes involve thinner dielectric and thus higher field strength, which makes them much more vulnerable to TDDB.

These and other matters have presented challenges to efficiencies of regional circuit implementations, for a variety of applications.

SUMMARY

Various example embodiments are directed to issues such as those addressed above and/or others which may become apparent from the following disclosure concerning stressing regional circuits using adjustable circuit-stress test conditions.

In certain example embodiments, aspects of the present disclosure involve adjustment of circuit-stress test conditions for overstressing the regional circuits, which are adjusted responsive to operational conditions of suspect reliability associated with dielectric breakdown of at least one of the plurality of different types of regional circuits.

In a more specific example embodiment, in an integrated circuit (IC) configured to indicate a reliability concern associated with the IC, a method includes stressing, under different circuit-stress test conditions, a plurality of different types of regional circuits susceptible to time dependent dielectric breakdown (TDDB) respectively located in different regions of the IC, and which are used for monitoring levels of reliability failure associated with any of the plurality of different types of regional circuits. The method further includes determining and storing a set of stress-test data based on the levels of reliability failure of the plurality of regional circuits, the set of stress-test data being stored within the IC to indicate reliability-threshold test data specific to the IC. Within the IC, the method includes detecting the one or more levels of reliability failure associated with any of the regional circuits and indicating one or more operational conditions of suspect reliability associated with dielectric breakdown of at least one of the plurality of different types of regional circuits via an on-chip monitoring circuit. And, logic circuitry, during operation of the IC, adjusts at least one of the different circuit-stress test conditions based on the indicated operational conditions of suspect reliability.

The regional circuits can include lifetime monitor circuits used to monitor the IC for circuit failure related to TDDB. The method can further include operating the IC under conditions which cause the logic circuitry in the IC to adjust the reliability-threshold test data based on the indicated operational conditions of suspect reliability. Stressing under different circuit-stress test conditions can include using activation circuits for overstressing the plurality of regional circuits with respect to one or more of the following parameters: electrical-field strength or voltage level, temperature, electrical activity, and recovery period corresponding to a time span over which one or more of the plurality of the regional circuits recovers, after being overstressed, to a previous state of operation or status.

The different circuit-stress test conditions can include at least one circuit-stress test condition which occurs during operation of the IC, and wherein the logic circuitry adjusts the reliability-threshold test data based on indicated operational conditions of suspect reliability failure detected in response to applying the at least one adjusted circuit-stress test condition. For example, the different circuit-stress test conditions include at least one circuit-stress test condition applied at a plurality of different times while operating the IC, and the logic circuitry adjusts the at least one circuit-stress test condition based on the set of stress-test data. The set of stress-test data can correspond to one or more criteria relating to mean time to failure (MTTF) due to any failure mechanism, MTTF due to TDDB, or TDDB. The method can further include providing failure statistics based on the each of the levels of reliability failure of the plurality of regional circuits, and wherein determining the set of stress-test data is also based on the failure statistics.

In a number of aspects, the different circuit-stress test conditions cause: a first overstress effect associated with a MTTF acceleration factor, a second overstress effect associated with a second MTTF acceleration factor which is lower than the first MTTF acceleration factor, and a third overstress effect associated with a third MTTF acceleration factor which is lower than the second MTTF acceleration factor. The adjusted at least one of the different circuit-stress test conditions includes feedback data developed from the indicated operational conditions of suspect reliability. In other embodiments, the adjusted at least one of the different circuit-stress test conditions is based on feedback data including update data provided from a source external to the IC.

In another specific example embodiment, an apparatus includes an IC including a plurality of different types of regional circuits susceptible to TDDB and that are respectively located in different regions of the IC. The apparatus further includes test circuitry used to stress the plurality of different types of regional circuits under different circuit-stress test conditions, and which are used for monitoring levels of reliability failure associated with any of the plurality of different types of regional circuits. Processing circuitry is used to determine and store a set of stress-test data based on each of the levels of reliability failure of the plurality of different types of regional circuits, the set of stress-test data being stored within the IC to indicate reliability-threshold test data specific to the IC. Within the IC, an on-chip monitoring circuit detects the levels of reliability failure associated with any of the plurality of different types of regional circuits and indicates operational conditions of suspect reliability of the plurality of different types of regional circuits based on the levels of reliability failure. Additionally, logic circuitry within the IC, during operation of the IC, adjusts at least one of the circuit-stress test conditions based on the indicated operational conditions of suspect reliability.

The regional circuits comprise lifetime monitor circuits that monitor the IC for circuit failure, and wherein each of the plurality of different types of regional circuits include a plurality of sub-regional circuits that are susceptible to TDDB. Each of the sub-regional circuits is located at different locations of the IC, and the plurality of different types regional circuits are overstressed with respect to the different circuit-stress test conditions including at least one of: a voltage, an electrical field strength, a temperature, an electrical activity, and a recovery period. In specific embodiments, the logic circuitry is used to apply the different circuit-stress test conditions and adjust the reliability-threshold test data including in response thereto. For example, the reliability-threshold test data corresponds to safety-critical reliability vehicle-operation data, which is adjusted responsive to the adjusted at least one circuit-stress test condition.

The apparatus further includes data-access circuitry within the IC. The processing circuitry can evaluate the IC and in response send feedback data to an external device via the data-access circuitry. The feedback data corresponds to the indicated operational conditions of suspect reliability. In other embodiments, logic circuitry communicates the indicated operational conditions of suspect reliability as an alert signal that is output from the IC to indicate an expected failure condition associated with the IC based on the adjusted at least one circuit-stress test condition. Although embodiments are not so limited and other actions can be taken, such as activating a redundant system, requesting maintenance, and/or extending the remaining lifetime (e.g., until the next scheduled maintenance date) by reducing the system performance and thus the stress applied to the IC.

The apparatus can further include a memory circuit for storing the set of stress-test data in a table. The table can include the different circuit-stress test conditions including the at least one adjusted circuit-stress test conditions arranged in rows and/or columns of the table, wherein each of the rows and/or columns is associated with one or more of the indicated operational conditions of suspect reliability. The processing circuit can be within the IC and can, during operation of the IC, update the table according to further instances of stress-test data. In more specific aspects, the rows and/or columns of the table are indicative of the operational conditions of suspect reliability in terms of at least one of: elapsed operating time of one of the plurality of regional circuits, a reason for data being entered in the table, an indication of which of the plurality of regional circuits manifested one or more of the indicated operational conditions of suspect reliability, and an indication of which of the different circuit-stress test conditions is associated with the data being entered in the table. The indicated operational conditions of suspect reliability can be indicative of a systemic failure of the IC.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
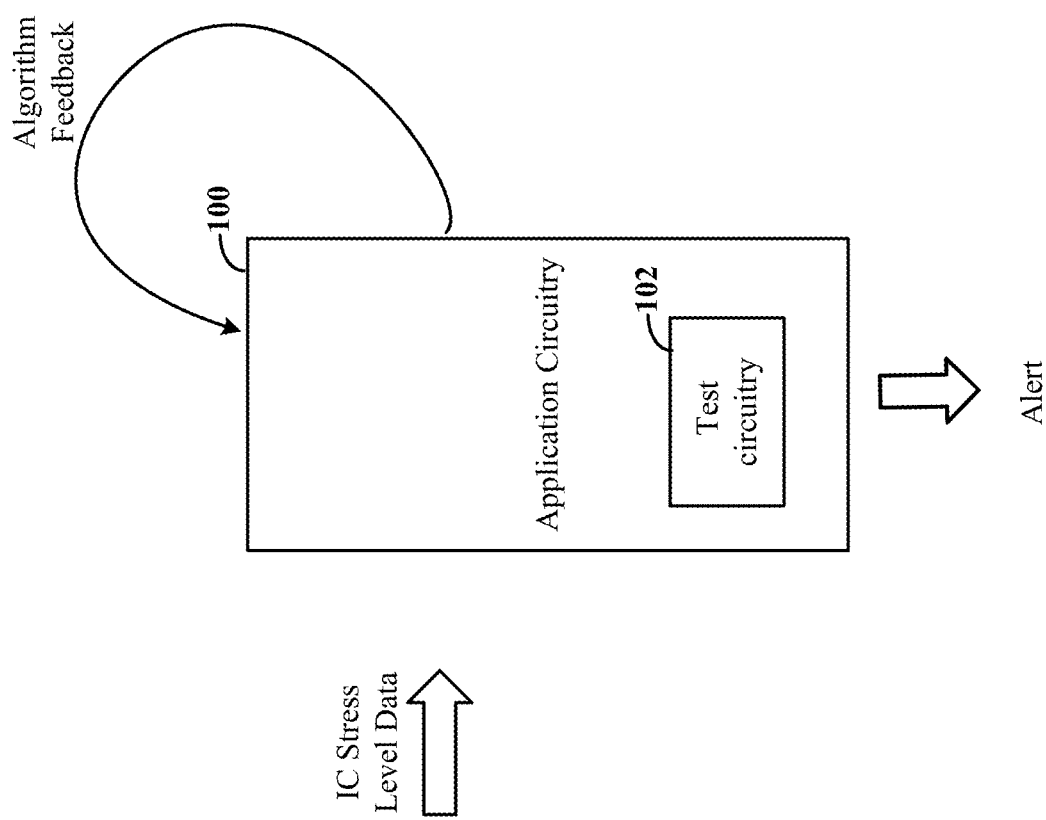
FIG. 1 illustrates an example of an apparatus, in accordance with various embodiments.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving stressing regional circuits using adjustable circuit-stress test conditions. In certain implementations, aspects of the present disclosure have been shown to be beneficial when used in the context of adjustment of circuit-stress test conditions for overstressing the regional circuits, which are adjusted responsive to operational conditions of suspect reliability associated with dielectric breakdown of at least one of the plurality of different types of regional circuits. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

The lifetime of various integrated circuits (ICs), such as modern complementary metal-oxide semiconductor (CMOS) ICs, can be limited by the effects of time-dependent dioxide breakdown (TDDB). TDDB can have the catastrophic effect of destroying a component without relevant advance warning. TDDB can occur when high electric fields cause total breakdown of the gate resulting in the failure of the transistor. Modern processes can involve thinner dielectric and thus higher field strength, which makes the IC more vulnerable to these effects. While a defective IC is a problematic issue, an early warning of upcoming IC failure can mitigate these issues. Upon such a warning, a redundant system can be activated, maintenance can be requested, and/or the remaining lifetime can be extended (e.g., until the next scheduled maintenance date) by reducing the system performance and thus the stress applied to the IC. In many instances, for TDDB time-to-fail predictions, various regional circuits are used to monitor the IC for circuit failure related to TDDB. The IC can include a plurality of different regional circuits, which can be lifetime monitor circuits. Each of the different regional circuits include a plurality of sub-regional circuits, or sub-monitors, that consist of structures that are vulnerable to TDDB and that are placed at different locations of the IC. The regional circuits can be intentionally overstressed to different levels (e.g., respectively medium level and high level) by applying different stress voltages or other stress conditions and, in some instances, exposed to the same temperature and time as a particular (e.g., useful/functional) part of the IC.

As aging acceleration of the IC due to the stress can be estimated, the time-to-fail of the sub-regional circuits can allow for predicting the time-to-fail of the particular part of the IC. For example, the IC can alert the user on an estimated end of life, which may be upcoming. The alert can allow for preventative replacement rather than reactive repair. It is believed that time-to-fail due to TDDB is Weibull-distributed, with the distribution parameters depending on many factors, such as process parameters, temperature, electrical activity, and field strength. Even when knowing such factors, the time-to-fail can be difficult to predict. Additionally, the relationship between overstress and aging acceleration may not be well-defined, and can depend on unknown parameters. Using regional circuits, e.g., lifetime monitors, with different overstress levels can assist in estimating the acceleration factor, but can bear the risk that the overstress levels are chosen too high or too low; in both cases the lifetime prediction becomes unreliable. Embodiments in accordance with the present disclosure can include adjusting the overstress level of at least one of the regional circuits by adjusting a stress voltage or other circuit-stress test condition used to overstress the regional circuits. The adjustment to the overstress level of the region circuit can be during lifetime of the IC and can depend on the number of sub-regional circuits of the regional circuit that have already failed and the elapsed operating time. Based on the adjustment, the estimated time-to-fail can be calculated.

In a number of specific embodiments, a method includes stressing a plurality of different types of regional circuits under different circuit-stress test conditions, which are used for monitoring levels of reliability failure associated with any of the plurality of different types of regional circuits. The regional circuits, which are susceptible to TDDB, can be located at different regions of the IC. For example, each of the different types of regional circuits includes a plurality of sub-regional circuits which are located at the different regions of the IC. In specific embodiments, the regional circuits are lifetime monitors consisting of a plurality of sub-monitor circuits and that are used to monitor the IC for circuit failure related to TDDB. The method further includes determining and storing a set of stress-test data based on each of the levels of reliability failure of the plurality of regional circuit. The set of stress-test data can be stored within the IC to indicate reliability-threshold test data specific to the IC. As used herein, the reliability-threshold test data can include or be indicative of mean time to failure (MTTF) or an estimated time to failure due to TDDB, such as an acceleration factor for aging in general, or TDDB and/or an estimated time-to-fail. An on-chip monitoring circuit within the IC can be used for detecting the one or more of the different regional circuits and to indicate one or more operational conditions of suspect reliability associated with dielectric breakdown of at least one of the plurality of different types of regional circuits. The operational conditions can be based on, for example, identification of a failure of one or more of the sub-regional circuits. For example, the operational conditions can include or be based on individual failures and can be used to provide failure statistics based on each of the levels of reliability failure of the plurality of regional circuits.

The regional circuits can be stressed using a variety of parameters. Examples of different circuit-stress test conditions can include one or more of the following parameters: electrical-field strength or voltage level, temperature, electrical activity, and recovery period corresponding to a time span over which one or more of the plurality of the regional circuits recovers, after being overstressed, to a previous state of operation or status. In specific embodiments, activation circuits can be used for overstressing the plurality of regional circuit with respect to the different circuit-stress test conditions. For example, the different circuit-stress test conditions include at least one circuit-stress test condition applied at a plurality of different times while operating the IC.

The method further includes providing logic circuitry in the IC which, during operation of the IC, adjusts at least one of the plurality of different circuit-stress test conditions based on the indicated operational conditions of suspect reliability. The adjustment to the at least one of the different circuit-stress test conditions can be in response to feedback to the IC. The feedback can include feedback data developed from the indicated operational conditions of suspect reliability, e.g., failure of one or more sub-regional circuit. In other embodiments and/or in addition, the feedback data includes update data provided from a source external to the IC, as further described herein.

In a number of specific embodiments, the different circuit-stress test conditions can cause different reliability-threshold data. For example, different circuit-stress test conditions cause: a first overstress effect associated with a first MTTF acceleration factor, a second overstress effect associated with a second MTTF acceleration factor which is lower than the first MTTF acceleration factor, and a third overstress effect associated with a third MTTF acceleration factor which is lower than the second MTTF acceleration factor.

In various embodiments, the method can further include adjusting the reliability-threshold data (e.g., an acceleration factor and/or estimated time-to-fail). For example, the IC can be operated under the stress-test conditions which cause the logic circuitry in the IC to adjust the reliability-threshold test data based on the indicated operational conditions of suspect reliability. In specific embodiments, the different circuit-stress test conditions include at least one circuit-stress test condition which occurs during operation of the IC, and the logic circuitry adjusts the reliability-threshold test data based on indicated operational conditions of suspect reliability failure detected responsive to applying the at least one adjusted circuit-stress test condition which occurs during operation of the IC. In related specific embodiments, the reliability-threshold test data corresponds to safety-critical reliability vehicle-operation data and which is adjusted responsive to the adjusted at least one circuit-stress test condition.

Other embodiments are directed to apparatuses used for adjusting the overstress levels over the lifetime of an IC. An example apparatus includes an IC having a plurality of different types of regional circuits susceptible to TDDB and respectively located in different regions of the IC. The apparatus further includes test circuitry that stresses the plurality of different types of regional circuits under different circuit-stress test conditions, and which are used for monitor levels of reliability failure associated with any of the plurality of different types of regional circuits. The levels of reliability failure includes or is based on operational conditions of one or more of a sub-regional circuits, e.g., the sub-regional circuit(s) of the regional circuits failing. Processing circuitry is used to determine and store a set of stress-test data based on each of the levels of reliability failure of the plurality of different types of regional circuits, the set of stress-test data being stored within the IC to indicate reliability-threshold test data specific to the IC. The apparatus further includes an on-chip monitoring circuit, within the IC, that detects the levels of reliability failure associated with the plurality of different types of regional circuits and indicates operational conditions of suspect reliability of the plurality of different types of regional circuits based on the levels of reliability failure. Additionally, logic circuitry within the IC, during operation of the IC, adjusts at least one of the circuit-stress test conditions based on the indicated operational conditions of suspect reliability. The indicated operational conditions of suspect reliability can be indicative of a systemic failure of the IC.

As previously described, the regional circuits include lifetime monitor circuits that monitor the IC for circuit failure, and are comprised of a plurality of different types of sub-regional circuits that are susceptible to TDDB. The plurality of different types of regional circuits are overstressed with respect to the different circuit-stress test conditions including at least one of: a voltage, an electrical field strength, a temperature, an electrical activity, and a recovery period.

The programming logic circuit and processing circuitry can further be used to adjust the reliability-threshold test data, such as an acceleration factor and/or estimated time-to-fail. For example, the programming logic circuit can apply the adjusted circuit-stress test condition and in response, the processing circuitry adjusts the reliability-threshold test data based on stress-test data obtained in response thereto.

In various embodiments, the apparatus further includes data-access circuitry, such as an input/output port, a central processing unit (CPU), and/or a communication channel/bus. The data-access circuitry can be within the IC. The processing circuit can evaluate the IC and in response, send feedback data to an external device via the data-access circuitry. The feedback data can correspond to the indicated operational conditions of suspect reliability, such as an alert and/or indication of MTTF and/or TDDB of the particular IC. For example, the programming logic circuitry can communicate the indicated operational conditions of suspect reliability as an alert signal that is output from the IC to indicate an expected failure condition associated with the IC based on the adjusted at least one circuit-stress test condition. Although embodiments are not so limited and other actions can be taken, such as activating a redundant system, requesting maintenance, and/or extending the remaining lifetime (e.g., until the next scheduled maintenance date) by reducing the system performance and thus the stress applied to the IC.

The apparatus can further include a memory circuit used for storing the set of stress-test data. For example, the set of stress-test data can be stored in a table, the table including the different circuit-stress test conditions, such as the at least one adjusted circuit-stress test conditions arranged in rows and/or columns of the table, wherein each of the rows and/or columns is associated with one or more of the indicated operational conditions of suspect reliability. The processing circuit, which can be located within the IC, can update the table according to further stress-test data. For example, the rows and/or columns of the table are indicative of the operational conditions of suspect reliability in terms of at least one of: elapsed operating time of one of the plurality of regional circuits, a reason for data being entered in the table, an indication of which of the plurality of regional circuits manifested one or more of the indicated operational conditions of suspect reliability, and an indication of which of the different circuit-stress test conditions is associated with the data being entered in the table.

Now turning the figures, FIG. 1 illustrates an example of an apparatus in accordance with various embodiments. The apparatus can include application circuitry 100 used to stress regional circuits of an IC and obtain sets of stress-test data in response thereto. The stress-test data is used to indicate reliability-threshold test data and to adjust one or more circuit-stress test conditions used to stress the regional circuits in response thereto. As may be appreciated, the application circuit 100 can be used for many different applications, such as a central processing unit, or can include an application-specific circuit, in various different embodiments.

The regional circuits can include a plurality of lifetime monitors used to monitor for TDDB and/or MTTF that impacts time-to-fail for the IC. Each regional circuit is overstressed to a different level and includes a plurality of sub-regional circuits (e.g., sub-monitors) that are susceptible to TDDB. As a specific example, the IC includes a first regional circuit that is highly overstressed via application of a first voltage value and a second regional circuit that is overstressed to a lower level then the first regional circuit (e.g., medium or mid-overstressed) via application of a second voltage value that is less than the first voltage value.

As may be understood by one of ordinary skill, time-to-fail due to TDDB is hard to predict. This holds true for MTTF, e.g., for the average of the expected time-to-fail over many ICs, and for the time-to-fail of an individual IC. As background, MTTF due to TDDB is strongly dependent on the frequency (e.g., approximately by a factor of three). There exist several models of MTTF and time-to-fail estimation, resulting in different estimates. The models can use the activation energy as a key parameter; however, the activation energy values in ICs may differ, e.g., between 0.6 eV and 0.9 eV. The acceleration factor for TDDB is a function of the stress voltage $V_s$ applied. It is believed that MTTF may be proportional to $\exp(V_s)$, and sometimes may be proportional to $V_s^n$. The range of the voltage acceleration for the stress voltage Vs can vary including:

MTTF can be proportional to $\exp(V_s)$: values vary from $\exp(V_s/9.26V) \ldots \exp(V_s/10.6V)$, and MTTF can be proportional to $V_s^n$: values vary from $V_s^{15} \ldots V_s^{20}$ to $V_s^{40}$.

Additionally, the type of logic gate (e.g., NAND, NOR) and the position of the transistor in the gate can determine an extent of the degradation due to TDDB depending on the gate type and position, the effect can be a factor of, for example, 2-3. All these statements underline that both the MTTF due to TDDB of an IC, and the acceleration factor for overstress cannot be derived from some known data, but are different and largely unknown for each combination of production process, field strength, electrical activity, temperature, etc. Hence, both MTTF of the IC and the acceleration factor for overstress can be determined empirically for each IC—namely by regional circuits (e.g., lifetime monitors) instead of being calculated upfront.

In addition to MTTF due to TDDB being difficult to estimate, also the time-to-fail of an individual IC can have a wide spread of approximately a factor of 10 between the time where the first ten percent of devices fail, and the time where ninety percent of the devices fail. This holds true for the time-to-fail of the IC, and for the sub-regional circuits. This wide spread poses a constraint to the number of sub-regional circuits as they are to be approximately in the range of 100 to reduce the standard deviation of the time-to-fail by a factor of 10. A sufficient number of sub-regional circuits is a basic constituent of various embodiments in accordance with the present disclosure.

The regional circuits are used to obtain a warning that a circuit failure is expected. The regional circuits include a plurality of sub-regional circuits that can be a replicated version of a functional circuit that performs a function(s) based on one or more input signals. The sub-regional circuits can be more susceptible to failure than the functional circuit due to application of circuit-stress conditions that expose the sub-regional circuit to parameters (e.g., voltage, temperature, magnetic field strength, etc.) which may be of greater magnitude than the functional circuit is exposed to by the input signals, e.g., the regional circuits are overstressed compared to the functional circuit. These regional circuits are overstressed and thus fail before the actual IC may fail. As the time-to-fail for the regional circuits follows a statistical distribution, the regional circuits are built up of several sub-regional circuits, e.g., sub-monitors, of which the time-to-fail can be determined independently.

The regional circuits thereby include circuits that are overstressed to different levels and which is used to estimate reliability-threshold test data, such as acceleration factor for over stress due to TDDB and/or MTTF and/or an estimated time-to-fail for the IC. Using regional circuits with different overstress levels can allow for estimation of the acceleration factor using different MTTF of the moderately overstressed and the highly overstressed regional circuits. Additionally, the overstress levels can be adjusted. The initial overstress levels selected may be too high or too low, which can cause the estimated time-to-fail to be unreliable. The overstress levels can be adjusted for one or more of the regional circuits and over the lifetime of the IC depending on the number of respective sub-regional circuits that have failed and an elapsed operating time which is used as feedback for adjusting the overstress levels and/or the estimated reliability-threshold data. In various embodiments, the regional circuits are stressed and monitored, such as by the test circuitry 102 of application circuitry 100 for monitoring levels of reliability failure (e.g., number of each type of sub-regional circuit that fail due to TDDB in a particular period of time). The levels of reliability failure can be detected and used as the feedback and to estimate an acceleration factor of TDDB and/or estimated time-to-fail for the IC. In response to the estimated time-to-fail being within a threshold period of the current time, the application circuitry 100 outputs an alert, such as to the user, to notify the user of the upcoming potential failure. The user can take action, such as replacing the IC prior to catastrophic failure. Although embodiments are not so limited and other actions can be taken, such as activating a redundant system, requesting maintenance, and/or extending the remaining lifetime (e.g., until the next scheduled maintenance date) by reducing the system performance and thus the stress applied to the IC.

Figure 2:
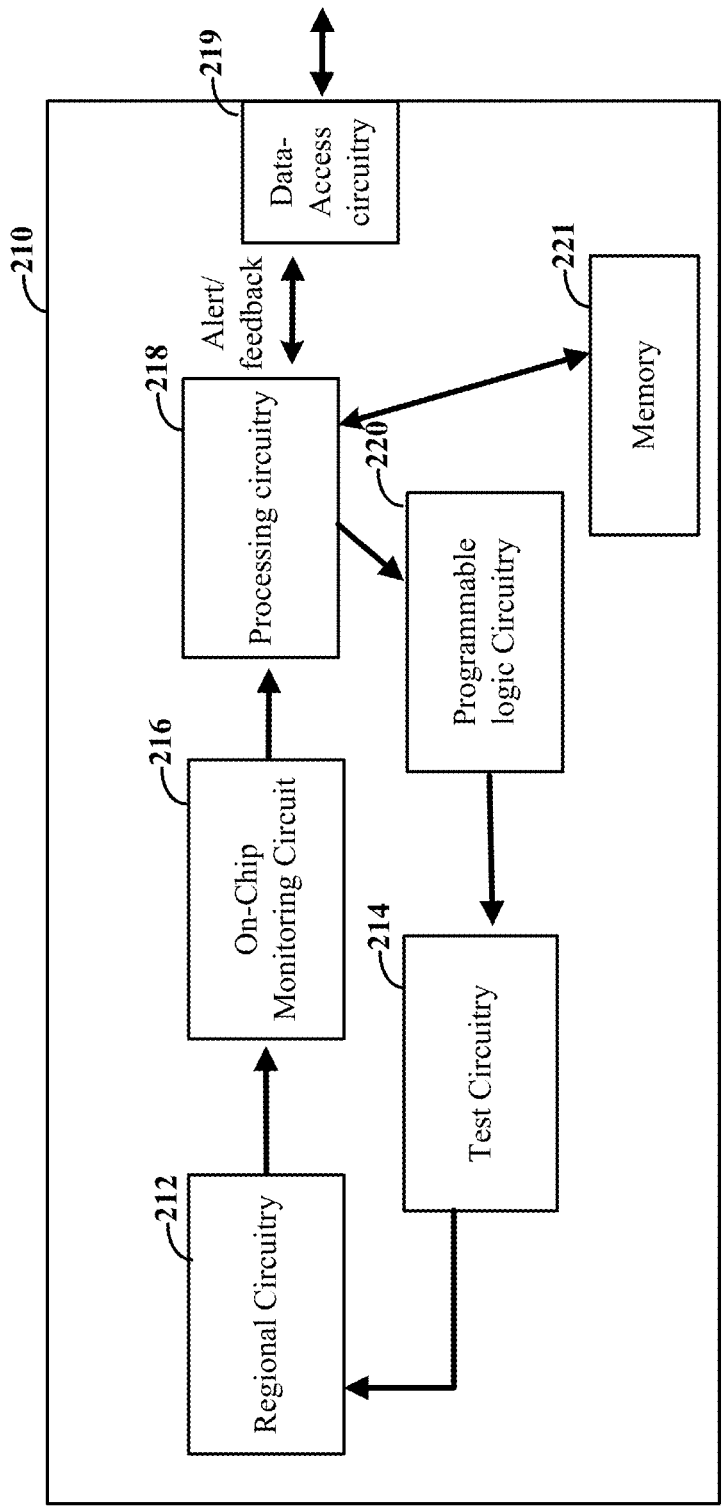
FIG. 2 illustrates an example apparatus, in accordance with various embodiments.

FIG. 2 illustrates an example apparatus in accordance with various embodiments. As illustrated the apparatus 210 includes an IC including regional circuitry 212. The regional circuitry 212 includes a plurality of different types of regional circuits susceptible to TDDB that are respectively located at different regions of the IC.

The regional circuits comprise lifetime monitor circuits used to monitor the IC for circuit failure, and wherein each of the plurality of different types of regional circuits include a plurality of sub-regional circuits that are susceptible to TDDB. For example, each of the sub-regional circuits are located at different locations of the IC, and the plurality of different types of regional circuits are overstressed with respect to the different circuit-stress test conditions including at least one of: a voltage, an electrical field strength, a temperature, an electrical activity, and a recovery period.

The test circuitry 214 can stress the regional circuitry 212. For example, the plurality of different types of regional circuits are stressed under different circuit-stress test conditions. In response to the stress, levels of reliability failure associated with any of the plurality of different types of regional circuits are monitored and/or detected. As previously described, the different circuit-stress test conditions can include overstressing the regional circuitry 212 with respect to one or more parameters including: electrical-field strength or voltage level, temperature, electrical activity, and recovery period corresponding to a time span over which one or more of the plurality of the regional circuits recovers, after being overstressed, to a previous state of operation or status. Activation circuits (not illustrated) can be used for the overstressing.

Processing circuitry 218 can determine and store a set of stress-test data based on the levels of reliability failure of the plurality of different types of regional circuits. The set of stress-test data stored within the IC can be indicative of the reliability-threshold test data specific to the IC. For example, the apparatus 210 further includes a memory circuit 221 used to store the set of stress-test data. The set of stress-test data can include elapsed operating time of one of the plurality of regional circuits, a reason for data being entered in the table, and/or an indication of which of the plurality of regional circuits manifested one or more of the indicated operational conditions of suspect reliability. The memory circuit 221 can store the set of stress-test data in a table. The table can include the different circuit-stress test conditions arranged in rows and/or columns, wherein each of the rows and/or columns is associated with one or more of the indicated operational conditions of suspect reliability (e.g., a failure of a sub-regional circuit). More specifically, the rows and/or columns of the table are indicative of the operational conditions of suspect reliability in terms of at least one of: elapsed operating time of one of the plurality of regional circuits, a reason for data being entered in the table, an indication of which of the plurality of regional circuits manifested one or more of the indicated operational conditions of suspect reliability, and an indication of which of the different circuit-stress test conditions is associated with the data being entered in the table. The processing circuitry 218 is within the IC and, during operation of the IC, updates the table according to further instances of stress-test data.

Within the IC, an on-chip monitoring circuit 216 detects the levels of reliability failure associated with the plurality of different types of regional circuits and indicates operational conditions of suspect reliability of the plurality of different types of regional circuits based on the levels of reliability failure. The indicated operational conditions of suspect reliability can be indicative of a failure of the IC.

The apparatus 210 further include logic circuitry 220 that is integrated with the IC. The logic circuitry 220 can, during operation of the IC, adjust at least one of the circuit-stress test conditions based on the indicated operational conditions of suspect reliability. As previously described, the adjustment can be responsive to the reliability threshold-test data. Additionally, the logic circuitry 220 can be used (in addition to the test circuitry 214) to apply the different circuit-stress test conditions and adjust the reliability-threshold test data, as previously described.

The apparatus can additionally include data-access circuitry 219 integrated with the IC. The data-access circuitry 219 can include an I/O port, a CPU, and/or a communications channel/bus. The processing circuitry 218 can evaluate the IC and, in response, send feedback data to an external device via the data-access circuitry 219. The feedback data can correspond to the indicated operational conditions of suspect reliability. Additionally, the logic circuitry 220 and/or processing circuitry 218 can communicate the indicated operational conditions of suspect reliability as an alert signal that is output from the IC to indicate an expected failure condition associated with the IC based on the adjusted at least one circuit-stress test condition, such as via the data-access circuitry 219.

As previously described, the overstress levels can be adjusted using one or more different measures. The overstress levels can be adjusted depending on the failure statistics of sub-regional circuits in the same IC. This ensures maximum accordance between the stress applied to the regional circuits and the stress applied to the IC.

In other embodiments and/or in addition, external feedback can be used to adjust the overstress levels. The trend towards permanent or at least regular access to the internet (such as with the "Internet of Things") can allow for feedback data from the IC to manufacturer, and also from the manufacturer to the IC. This can be used for providing data for the adjustment of the overstress level. By this, the following options can be considered. A first option can include adjustment of the overstress level depending on the failure statistics of sub-regional circuits in other ICs of the same type, derived from field statistics and conveyed via internet, GSM, during maintenance, etc., from IC manufacturer to IC. This leads to somewhat less accordance between the stress applied to the regional circuits and the stress applied to the IC, but it opens a much larger statistical basis. Another option, and/or in addition, is to adjust adapt the overstress level depending on the failure statistics of sub-regional circuits in other ICs of different types but in the same manufacturing process, derived from field statistics and conveyed via internet, GSM, maintenance, etc., from IC manufacturer to IC. This leads to even less accordance between the stress applied to the regional circuits and the stress applied to the IC, but it opens an even much larger statistical basis.

Figure 3:
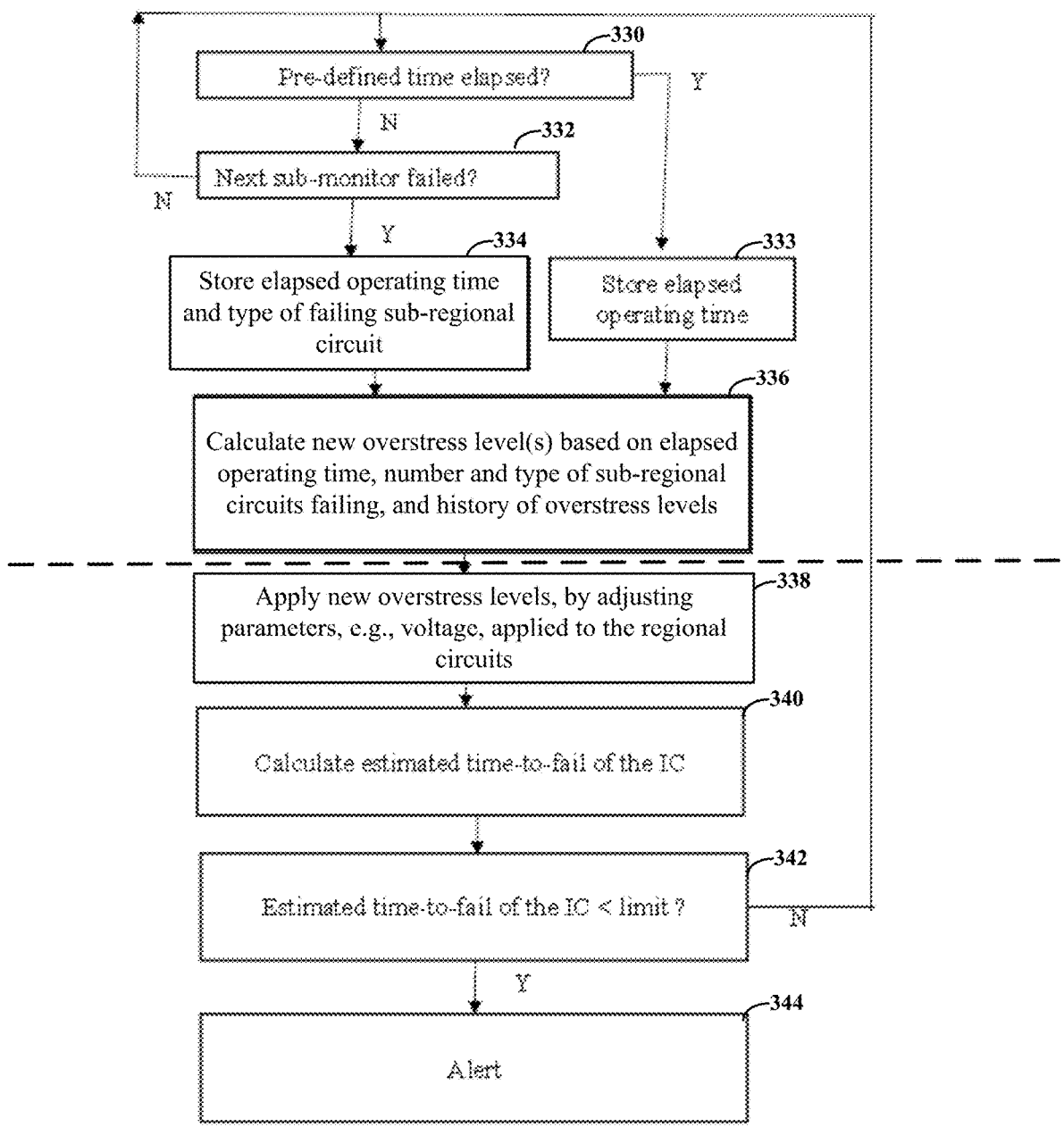
FIG. 3 illustrates an example method, in accordance with various embodiments.

FIG. 3 illustrates an example method in accordance with various embodiments. As previously described, the regional circuits can include at least two types of regional circuits that are stressed to different overstress levels. In specific embodiments, a first regional circuit is overstressed to a first level (e.g., a high level), and a second regional circuit is overstressed to a second level (e.g., a medium level) that is lower than the first level. Each of the regional circuits includes a plurality of sub-regional circuits that are located at different locations of the IC and are stressed to a higher level than the functional circuits of the IC. Another circuit, such as processing circuitry of the IC, can track the elapsed operating time of the IC. Once one or more of the sub-regional circuits fail, the failure is recorded together with the elapsed operating time on-chip and/or by a supervisor outside of the IC. Depending on the estimated remaining lifetime, one or more measures are taken, such as providing an alert that recommends a replacement of the IC.

As illustrated by FIG. 3, a method can include supervision of the sub-regional circuits which is used to adjust one or more of the overstress levels after failing of a sub-regional circuit and/or after elapsing of a pre-defined time period and the estimation of the remaining time-to-fail of the IC. Although not illustrated, the plurality of different types of regional circuits are stressed under different circuit-stress conditions, and are used for monitoring levels of reliability failure associated with any of the plurality of different types of regional circuits. For example, at 330, the method includes determining if a pre-defined time has elapsed. If so, at 333, the elapsed time is stored, such as in a table as further described herein. If not, a determination is made on whether or not a sub-regional circuit has failed, at 332. If not, the method returns to determine if another pre-defined time has elapsed at 330. If a sub-regional circuit has failed, at 334, the elapsed operating time (which is less than the pre-defined time) is stored along with identification of the type of failing sub-regional circuit. For example, the storing at 334 and 333 can include determining and storing sets of stress-test data, as previously described, that are based on the levels of reliability failure of the different types of regional circuits. The sets of stress-test data can be stored within the IC to indicate reliability-threshold test data (e.g., acceleration factor and/or estimated time-to-fail) specific to the IC. As previously described, an on-chip monitoring circuit can detect the levels of reliability failure and indicate one or more operational conditions of suspect reliability, e.g., failure, associated with dielectric breakdown of at least one of the plurality of different types of regional circuits.

At 336, the method includes calculating new overstress levels for each of the different types of regional circuits based on the set of stress-data. As illustrated, the set of stress-data can include elapsed operating time, number and type of sub-regional circuits failing thus far, and/or history of overstress levels, among other data. The set of stress-test data corresponds to one or more criteria related to MTTF and/or TDDB. An example of a table that includes the sets of stress-test data can include:

| Elapsed operating Time | Reason for new table entry | Monitor failing | Overstress for mid-overstress monitors | Overstress for high-overstress monitors |
|---|---|---|---|---|
| 1000 h | Time elapsed | — | 5 | 25 |
| 2000 h | Time elapsed | — | 5 | 25 |
| 2450 h | Submonitor fail | High-overstress | 4 | 16 |
| 3450 h | Time elapsed | — | 4 | 16 |
| 4221 h | Submonitor fail | High-overstress | 4 | 16 |
| 4798 h | Submonitor fail | Mid-overstress | 4 | 16 |
| 5334 h | Submonitor fail | High-overstress | 4 | 16 |

The above table is provided for illustrative purposes only and is not intended to be limiting.

Programming logic circuitry can be used to adjust the at least one overstress level based on the indicated operational conditions of suspect reliability. For example, the programming logic can communicate the adjusted overstress level/levels to the test circuitry. As illustrated, at 338, the new overstress levels (e.g., stress voltages) are applied, such as by adjusting the voltages applied to one or more of the different regional circuits.

In response to the adjusted overstress levels, an estimated time-to-fail of the IC is calculated, at 340. For example, the time-to-fail of the IC can be calculated based on an updated acceleration factor of TDDB and/or based on MTTF determined using the stress-test data. At 342, the estimated time-to-fail is compared to a limit and in response to the estimated time-to-fail falling outside the limit (e.g., being less than the limit), and alert can be provided at 344. For example, the alert can indicate to replace the IC.

As previously described, MTTF due to TDDB can be proportional to $\exp(V/V_c)$ or to $V^x$. With $V_c$ and $x$ being in a range (e.g., wide) that depends on process, temperature, material and quality of the dielectric, etc. The time-to-fail and/or the Weibull parameters of time-to-fail are predicted empirically using the overstressed regional circuits (e.g., monitors), as described above.

Such embodiments can be used for prediction of IC time-to-fail using regional circuits, e.g., lifetime monitors, for catastrophic failures (e.g., TDDB), with a threshold number of sub-regional circuits. A number of embodiments include at least two different types of regional circuits with different, adaptable overstress levels, which are adapted according to the failure statistics of sub-regional circuits in the same IC and/or of other ICs in the field, which is fed back to the IC. A number of embodiments include calculating the remaining lifetime based on the time-to-fail of the sub-regional circuits along with the respective elapsed operating time at this failure. The embodiments can be applied to variety of types of ICs.

Figure 4:
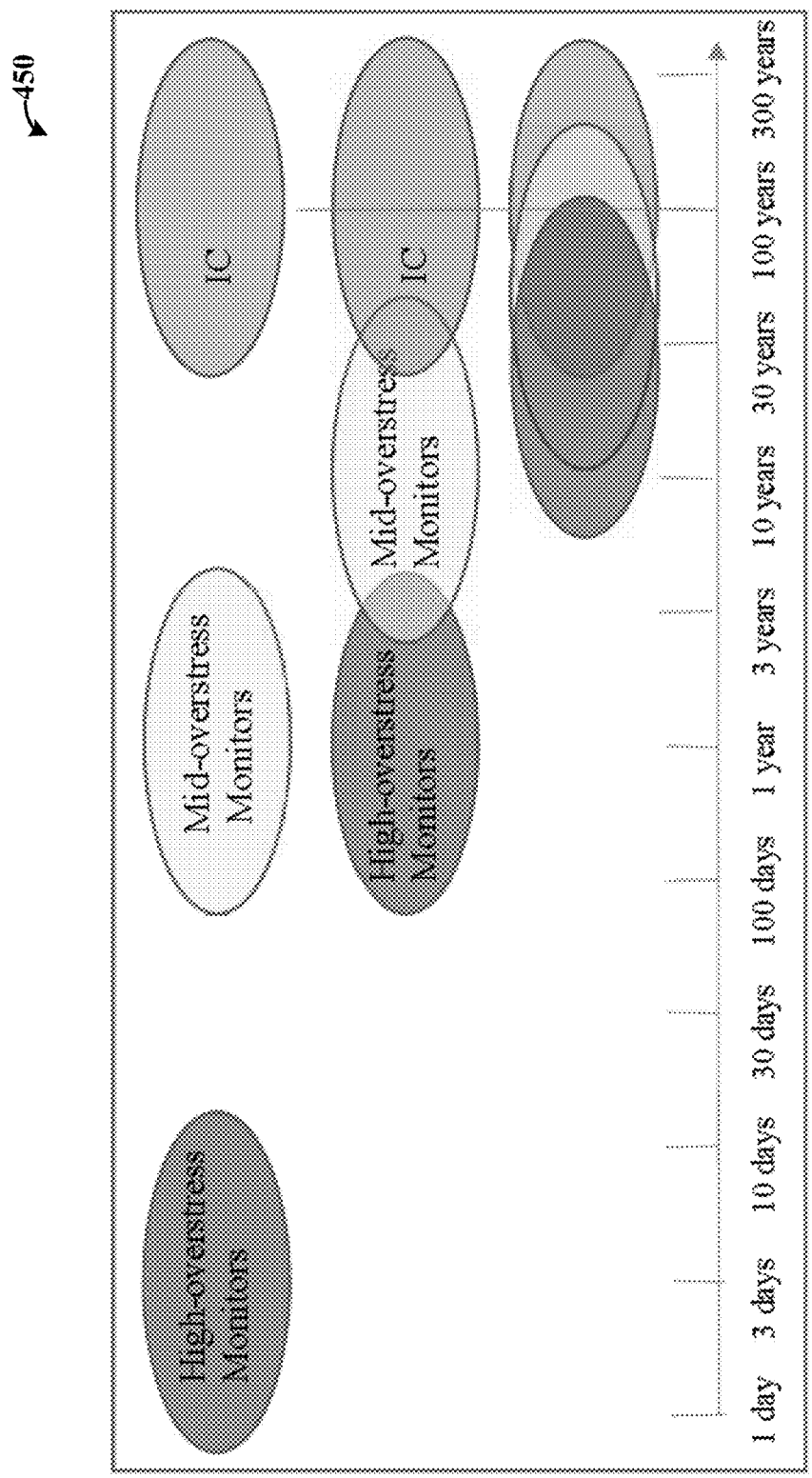
FIG. 4 is a graph illustrating example estimations of reliability-threshold test data, in accordance with various embodiments.

FIG. 4 is a graph illustrating example estimations of reliability-threshold test data, in accordance with various embodiments. The graph 450 includes a specific example of two types of regional circuits with two different overstress levels, e.g., High-Stress Monitor (HSM) and Mid-Stress Monitor (MSM). The HSM and MSM can lead to estimated MTTFs of $MTTF_{HSM}$ and $MTTF_{MSM}$. From both regional circuit types, there are several identical sub-regional circuits implemented. The example illustrated by the graph 450 assumes the lifetime of the IC is estimated correctly to be $MTTF_{IC}$=100 years, and Weibull-distributed with a spread of approximately a factor of 10 between the first 10% failing and the first 90% failing. Given these assumptions, 80% of the ICs may fail between 30 and 300 years.

Furthermore, assume that the overstress levels have been chosen such that:

$MTTF_{MSM}/MTTF_{HSM}\approx 10$ and $MTTF_{IC}/MTTF_{MSM}\approx 10$.

The graph 450 illustrates three cases with the two types of regional circuits. For the first case (e.g., top row of circuits), the overstress levels cause an effect that is higher than intended, leading to an acceleration factor of 100, for example:

$MTTF_{MSM}/MTTF_{HSM}\approx 100$ and $MTTF_{IC}/MTTF_{MSM}\approx 100$.

Based on this, the HSM are estimated to fail after $MTTF_{IC}/(100*100)$–3.5 days (80% fail between 1 and 10 days). The MSM are estimated to fail after $MTTF_{IC}/100$=1 year (80% fail between 0.30 and 3 years). The regional circuits are not anticipated to survive the majority of the lifetime (99 out of a 100 years).

For the second case (middle row of circles), the overstress levels cause an effect that is as intended, leading to an acceleration factor of 10, for example:

$MTTF_{MSM}/MTTF_{HSM}\approx 10$ and $MTTF_{IC}/MTTF_{MSM}\approx 10$.

Based on this, the HSM are estimated to fail after $MTTF_{IC}/(10*10)$=1 year (80% fail between 0.30 and 3 days). The MSM are estimated to fail after $MTTF_{IC}/10$=10 years (80% fail between 3 and 30 years).

For the third case (bottom row of circles), the overstress levels cause an effect that is less than intended, leading to an acceleration factor of 2, for example:

$MTTF_{MSM}/MTTF_{HSM}\approx 2$ and $MTTF_{IC}/MTTF_{MSM}\approx 2$.

Based on this, the HSM are estimated to fail after $MTTF_{IC}/(2*2)$–25 years (80% fail between 8 and 75 days). The MSM are estimated to fail after $MTTF_{IC}/2$=50 years (80% fail between 16 and 150 years). This third case provides too much overlap, and the regional circuit may not be able to predict the MTTF.

The above-described embodiments can be used for automobile applications. For example, various automotive safety standards require a certain Failure In Time level (FIT) to be kept, e.g., the number of safety-sensitive failures per $10^9$ operating hours may not exceed a certain limit. IC manufacturers may show that they will keep the FIT rate, using process reliability data (that show how many defects occur over lifetime) and data of the functional safety concept (that show how many of these defects are safety-sensitive, and how many of the safety-sensitive can be mitigated by functional safety measures). The limit for safety-sensitive defects can be tight: it is e.g., 100 FIT for ASIL B and 10 FIT for ASIL D. These rates refer to a complete system, however, each IC is allowed to have only a fraction of this failure rate. Failure mitigation methods can help reduce the FIT rate, however they are usually limited in such a way that increasing failure rate due to aging cannot be sufficiently compensated without violating the FIT targets. Given this potentially headroom for increased failure rate due to aging, mechanisms can be used to detect and counteract aging before it results in a relevant increase of the failure rate. Then the IC manufacturers can prove that the required failure rate is kept over the expected lifetime of the system.

However, embodiments are not limited to automobile implementations. For example, various embodiments are directed to different types of consumer ICs that are stressed at a high level. Examples include PC processors and graphic card ICs that are overclocked and operated at a higher supply voltage than rated, in order to achieve maximum performance, but at the cost of reduced lifetime. A user might wish to be informed about the expected remaining lifetime of these ICs, in order to decide whether or not to continue operating the IC in the overclocked mode. Another example includes large server farms, in which lifetime of memories is an economic issue, and the warning due to increased correctable failures is not early enough and pre-emptive replacement of RAMs may save money. An additional example can be referred to as "recycled" or counterfeit ICs which are fed into the supply chain without the consent of the IC manufacturer, and bear the risk of an excessive failure rate which might damage the manufacturer's reputation.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other circuit-type depictions (e.g., reference numerals 212 and 216 of FIG. 2 depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 1 and 2. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described at FIG. 3 is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit).

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, a method can include more or fewer steps than illustrated by the example of FIG. 3. As another example, an apparatus can include additional or fewer components than illustrated by FIG. 2. More specifically, one or more of the circuits illustrated by FIG. 2 can be off-chip from other circuits. Such modifications do not depart from the true spirit and scope of various aspects of the disclosure, including aspects set forth in the claims.

What is claimed is:

1. In an integrated circuit configured to indicate a reliability concern associated with the integrated circuit, a method comprising:
   stressing, under different circuit-stress test conditions, a plurality of different types of regional circuits susceptible to time dependent dielectric breakdown (TDDB) respectively located in different regions of the integrated circuit, and which are used for monitoring levels of reliability failure associated with any of the plurality of different types of regional circuits;
   determining and storing a set of stress-test data based on the levels of reliability failure of the plurality of different types of regional circuits, the set of stress-test data being stored within the integrated circuit to indicate reliability-threshold test data specific to the integrated circuit;
   within the integrated circuit, detecting the levels of reliability failure of one or more of the plurality of different types of regional circuits via an on-chip monitoring circuit and indicating one or more operational conditions of suspect reliability associated with dielectric breakdown of at least one of the plurality of different types of regional circuits, wherein said at least one of the plurality of different types of regional circuits is different from one another of the plurality of different types of regional circuits in terms of manifesting respectively different overstress levels; and
   providing logic circuitry in the integrated circuit which, during operation of said one or more of the plurality of different types of regional circuits in the integrated circuit, adjusts at least one of the different circuit-stress test conditions based on the indicated operational conditions of suspect reliability.

2. The method of claim 1, wherein the different types of regional circuits include lifetime monitor circuits configured and arranged to monitor the integrated circuit for circuit failure related to TDDB, further including operating the integrated circuit under conditions which cause the logic circuitry in the integrated circuit to adjust the reliability-threshold test data based on the indicated operational conditions of suspect reliability.

3. The method of claim 1, wherein stressing under different circuit-stress test conditions includes using activation circuits for overstressing the plurality of different types of regional circuits with respect to one or more of the following parameters: electrical-field strength or voltage level, temperature, electrical activity, and recovery period corresponding to a time span over which one or more of the plurality of the different types of regional circuits recovers, after being overstressed, to a previous state of operation or status.

4. The method of claim 1, wherein the set of stress-test data corresponds to one or more criteria relating to mean time to failure (MTTF) due to a failure mechanism or MTTF due to TDDB.

5. The method of claim 1, wherein the different circuit-stress test conditions include at least one circuit-stress test condition which occurs during operation of said one or more of the plurality of different types of regional circuits in the integrated circuit, and wherein the logic circuitry adjusts the reliability-threshold test data based on indicated operational conditions of suspect reliability failure detected responsive to applying the at least one adjusted different circuit-stress test condition which occurs during operation of said one or more of the plurality of different types of regional circuits in the integrated circuit.

6. The method of claim 1, wherein the different circuit-stress test conditions include at least one circuit-stress test condition applied at a plurality of different times while operating the integrated circuit, and wherein the logic circuitry adjusts the at least one circuit-stress test condition based on the set of stress-test data.

7. The method of claim 1, wherein the different circuit-stress test conditions cause: a first overstress effect associated with a first mean time to failure (MTTF) acceleration factor, a second overstress effect associated with a second MTTF acceleration factor which is lower than the first MTTF acceleration factor, and a third overstress effect associated with a third MTTF acceleration factor which is lower than the second MTTF acceleration factor.

8. The method of claim 1, further including providing failure statistics based on the each of the levels of reliability failure of the plurality of different types of regional circuits, and wherein determining the set of stress-test data is based on the failure statistics.

9. The method of claim 1, wherein the adjusted at least one of the different circuit-stress test conditions includes feedback data developed from the indicated operational conditions of suspect reliability.

10. The method of claim 1, wherein the adjusted at least one of the different circuit-stress test conditions is based on feedback data including update data provided from a source external to the integrated circuit.

11. An apparatus comprising:
    an integrated circuit including a plurality of different types of regional circuits susceptible to time dependent dielectric breakdown (TDDB) respectively located in different regions of the integrated circuit, wherein said at least one of the plurality of different types of regional circuits is different from one another of the plurality of different types of regional circuits in terms of manifesting respectively different overstress levels;

test circuitry to stress, the plurality of different types of regional circuits under different circuit-stress test conditions to enable levels of reliability failure associated with any of the plurality of different types of regional circuits to be detected in response;

processing circuitry to determine and store a set of stress-test data based on each of the levels of reliability failure of the plurality of different types of regional circuits, the set of stress-test data being stored within the integrated circuit to indicate reliability-threshold test data specific to the integrated circuit;

within the integrated circuit, an on-chip monitoring circuit to detect the levels of reliability failure associated with any of the plurality of different types regional circuits and to indicate operational conditions of suspect reliability of the plurality of different types of regional circuits based on the levels of reliability failure; and logic circuitry within the integrated circuit and configured and arranged to, during operation of said one or more of the plurality of different types of regional circuits in the integrated circuit, adjust at least one of the circuit-stress test conditions based on the indicated operational conditions of suspect reliability.

12. The apparatus of claim 11, wherein the plurality of different types of regional circuits comprise lifetime monitor circuits configured to monitor the integrated circuit for circuit failure, and wherein each of the plurality of different types of regional circuits include a plurality of sub-regional circuits that are susceptible to TDDB.

13. The apparatus claim 12, wherein each of the sub-regional circuits are located at different locations of the integrated circuit, and the plurality of different types of regional circuits are to be overstressed with respect to the different circuit-stress test conditions including at least one of: a voltage, an electrical field strength, a temperature, an electrical activity, and a recovery period; and wherein the logic circuitry to be apply the different circuit-stress test conditions and adjust the reliability-threshold test data including in response thereto.

14. The apparatus of claim 11, further including data-access circuitry within the integrated circuit, and wherein the processing circuitry is further configured and arranged to evaluate the integrated circuit and in response send feedback data to an external device via the data-access circuitry and wherein the feedback data corresponds to the indicated operational conditions of suspect reliability.

15. The apparatus of claim 11, further including a memory circuit configured for storing the set of stress-test data in a table, the table including the different circuit-stress test conditions which includes the at least one adjusted circuit-stress test condition arranged in rows and/or columns of the table, wherein each of the rows and/or columns is associated with one or more of the indicated operational conditions of suspect reliability.

16. The apparatus of claim 15, wherein the processing circuit is within the integrated circuit and is configured and arranged to, during operation of said one or more of the plurality of different types of regional circuits in the integrated circuit, update the table according to further instances of stress-test data.

17. The apparatus of claim 15, wherein the rows and/or columns of the table are indicative of the operational conditions of suspect reliability in terms of at least one of: elapsed operating time of one of the plurality of regional circuits, a reason for data being entered in the table, an indication of which of the plurality of regional circuits manifested one or more of the indicated operational conditions of suspect reliability, and an indication of which of the different circuit-stress test conditions is associated with the data being entered in the table.

18. The apparatus of claim 11, wherein the reliability-threshold test data corresponds to safety-critical reliability vehicle-operation data and the processing circuitry is further configured and arranged to adjust the reliability-threshold test data responsive to the adjusted at least one circuit-stress test condition.

19. The apparatus of claim 11, wherein the indicated operational conditions of suspect reliability is indicative of a systemic failure of the integrated circuit.

20. The apparatus of claim 11, wherein the logic circuitry is further configured to communicate the indicated operational conditions of suspect reliability as an alert signal that is output from the integrated circuit to indicate an expected failure condition associated with the integrated circuit based on the adjusted at least one circuit-stress test condition.

* * * * *